United States Patent
Inada et al.

(10) Patent No.: US 8,277,681 B2
(45) Date of Patent: Oct. 2, 2012

(54) METAL POLISHING SLURRY AND CHEMICAL MECHANICAL POLISHING METHOD

(75) Inventors: Hiroshi Inada, Haibara-gun (JP); Masaru Yoshikawa, Haibara-gun (JP); Tadashi Inaba, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 633 days.

(21) Appl. No.: 12/394,507

(22) Filed: Feb. 27, 2009

(65) Prior Publication Data

US 2009/0221145 A1 Sep. 3, 2009

(30) Foreign Application Priority Data

Feb. 29, 2008 (JP) ................................ 2008-050115

(51) Int. Cl.
*C09K 13/06* (2006.01)
(52) U.S. Cl. .................. 252/79.4; 252/79.1; 438/692
(58) Field of Classification Search .................. 438/691, 438/692, 693; 252/79.1, 2, 79.2, 79.3, 79.4
See application file for complete search history.

(56) References Cited

U.S. PATENT DOCUMENTS

| | | | |
|---|---|---|---|
| 4,944,836 A | 7/1990 | Beyer et al. | |
| 4,954,142 A | 9/1990 | Carr et al. | |
| 7,906,038 B2 * | 3/2011 | Kato | 252/79.1 |
| 2004/0162011 A1 * | 8/2004 | Konno et al. | 451/41 |
| 2004/0244300 A1 * | 12/2004 | Ichiki et al. | 51/307 |
| 2007/0251156 A1 * | 11/2007 | Siddiqui | 51/307 |

FOREIGN PATENT DOCUMENTS

| | | |
|---|---|---|
| JP | 02-278822 A | 11/1990 |
| JP | 08-064594 A | 3/1996 |
| JP | 08-083780 A | 3/1996 |
| JP | 2005-116987 A | 4/2005 |

OTHER PUBLICATIONS

F. B. Kaufman, et al., "Chemical-Mechanical Polishing for Fabricating Patterned W Metal Features as Chip Interconnects", Journal of Electrochemical Society, 1991, pp. 3460-3464, vol. 138, No. 11.

* cited by examiner

*Primary Examiner* — Lan Vinh
(74) *Attorney, Agent, or Firm* — Sughrue Mion, PLLC

(57) ABSTRACT

A metal polishing slurry which is capable of simultaneously realizing a high polishing speed and reduced dishing in the polishing of a subject to be polished is provided. The metal polishing slurry includes, an oxidizing agent; and an organic acid; and a compound represented by the following general formula (1):

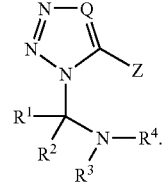

General formula (1)

22 Claims, No Drawings

METAL POLISHING SLURRY AND CHEMICAL MECHANICAL POLISHING METHOD

The entire contents of all documents cited in this specification are incorporated herein by reference.

BACKGROUND OF THE INVENTION

This invention relates to a metal polishing slurry for use in chemical mechanical polishing planarization in the manufacture of semiconductor devices. This invention also relates to a polishing method using such metal polishing slurry.

In the development of semiconductor devices such as semiconductor integrated circuits (hereinafter referred to as "LSI devices"), the trend toward smaller sizes and higher processing speeds has created a need in recent years for higher density and higher integration by the adoption of miniaturization and multilayer constructions of interconnection. Various techniques are being used to this end, including chemical mechanical polishing (hereinafter also referred to as "CMP").

CMP is an essential technique for carrying out, for example, the surface planarization of a film to be processed (e.g., an interlayer dielectric film), plug formation, and buried metal interconnect formation, and this technology is used to carry out substrate planarization and to remove surplus metal thin film during the formation of interconnections. (See U.S. Pat. No. 4,944,836 B and JP 2-278822 A.)

CMP generally involves attaching a polishing pad onto a circular platen, impregnating the surface of the polishing pad with a polishing slurry, pressing the right side of a substrate (wafer) against the pad, and rotating both the platen and the substrate while applying a predetermined pressure (polishing pressure) from the back side of the substrate so as to planarize the right side of the substrate by the mechanical friction that arises.

The metal polishing slurry used in CMP typically includes fine abrasive particles (such as alumina and silica) and an oxidizer (such as hydrogen peroxide). It is believed that polishing takes place with oxidization of the metal surface by the oxidizer and removal of the resulting oxide film by the abrasive. The detailed procedure is described, for example, in Journal of Electrochemical Society, 1991, vol. 138, No. 11, pages 3460 to 3464.

However, the CMP conducted by using such metal polishing slurry containing the solid abrasive is associated with the risk of scratches formed by the polishing (scratches), excessive polishing of the entire polishing surface (thinning), deformation of the polished metal surface in the shape of a dish (dishing), and excessive polishing of the insulator between the metal interconnect wiring and dish-shape deformation of the wired metal surface (erosion).

JP 8-64594 A and JP 8-83780 A, for example, refer to incorporation of 1,2,3-benzotriazole or 2-aminothiazole in the polishing slurry as a means for suppressing such drawbacks, and in particular, the dishing. JP 2005-116987 A discloses that use of a benzotriazole derivative is effective in reducing the dishing.

SUMMARY OF THE INVENTION

However, in the investigation of the dishing by the inventors of the present invention, 1,2,3-benzotriazole and its derivative as well as 2-aminothiazole were insufficient in improving the phenomenon of dishing.

As described above, simultaneous realization of the high polishing speed and the reduction of the dishing is yet insufficient, and the present invention has been completed in view of such situation and in an attempt for realizing the object as described below.

Accordingly, an object of the present invention is to provide a metal polishing slurry which is capable of simultaneously realizing the high polishing speed and the reduced dishing in the polishing of a subject to be polished (wafer). Another object of the present invention is to provide a chemical mechanical polishing method using such metal polishing slurry.

The inventors of the present invention made an intensive study for obviating the problems as described above, and found that such problems can be obviated by using a metal polishing slurry and the polishing method using such metal polishing slurry as described below. The present invention has been completed on the basis of such finding.

The metal polishing slurry and the polishing method using such metal polishing slurry of the present invention, and the compound preferable for such use are as described below.

[1] A metal polishing slurry used for chemical mechanical polishing in producing a semiconductor device, wherein the metal polishing slurry comprises a compound represented by the following general formula (1):

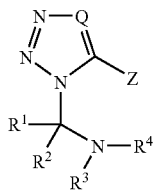

General formula (1)

wherein Q represents nitrogen atom or $CR^5$, Z represents hydrogen atom, a halogen atom, an aliphatic hydrocarbon group, an aryl group, a heterocyclic group, carboxyl group, a carbamoyl group, an acylamino group, amino group, or cyano group, $R^1$ and $R^2$ independently represent hydrogen atom, an aliphatic hydrocarbon group, an aryl group, or a heterocyclic group, $R^3$ and $R^4$ independently represents hydrogen atom, an alkyl group having carboxyl group, an alkyl group having hydroxyl group, an alkyl group having tertiary amino group, or an alkyl group, and $R^5$ represents hydrogen atom, a halogen atom, an aliphatic hydrocarbon group, an aryl group, a heterocyclic group, carboxyl group, a carbamoyl group, an acylamino group, or cyano group, with the proviso that $R^1$ and $R^2$ or $R^3$ and $R^4$ may together represent a cyclic group, an oxidizing agent, and an organic acid.

[2] The metal polishing slurry according to [1] wherein $R^5$ in $CR^5$ represented by Q in the general formula (1) is hydrogen atom, an alkyl group, an aryl group, a heterocyclic group, carboxyl group, a carbamoyl group, an acylamino group, or cyano group.

[3] The metal polishing slurry according to [1] wherein Q in the general formula (1) is nitrogen atom.

[4] The metal polishing slurry according to [1] wherein $R^1$ and $R^2$ in the general formula (1) are independently hydrogen atom or a linear, branched, or cyclic alkyl group, aryl group, or heterocyclic group.

[5] The metal polishing slurry according to [1] wherein $R^3$ and $R^4$ in the general formula (1) are independently a linear, branched, or cyclic alkyl group having hydroxyl group.

[6] The metal polishing slurry according to [1] wherein Z in the general formula (1) is hydrogen atom, a linear, branched, or cyclic alkyl group, an aryl group, a heterocyclic group, carboxyl group, a carbamoyl group, an acylamino group, amino group, or cyano group.

[7] The metal polishing slurry according to [1] further comprising a surfactant represented by the following general formula (2):

$$R-Ar-O-Ar-SO_3^- M^+ \qquad \text{General formula (2)}$$

wherein R represents a linear or branched alkyl group containing 8 to 20 carbon atoms, Ar represents aryl group, and $M^+$ represents hydrogen ion, an alkali metal ion, or ammonium ion.

[8] The metal polishing slurry according to [1] further comprising an abrasive.

[9] The metal polishing slurry according to [8] wherein the abrasive is a colloidal silica having a primary particle size of 20 to 40 nm and a degree of association of up to 2.

[10] The metal polishing slurry according to [9] wherein the colloidal silica is the colloidal silica in which at least a part of the silicon atoms on the surface are modified with aluminum atom.

[11] The metal polishing slurry according to [1] wherein the organic acid is amino acid.

[12] A chemical mechanical polishing method for polishing an object having a surface to be polished, wherein the metal polishing slurry of any one of [1] to [11] is supplied to a polishing pad on a polishing platen while rotating the polishing platen to move the polishing pad in relation to the surface to be polished of the object which is in contact with the polishing pad to thereby polish the surface to be polished of the object.

The present invention provides a metal polishing slurry which is capable of simultaneously realizing the high polishing speed and the reduced dishing in polishing the subject to be polished (wafer). The present invention also provides a chemical mechanical polishing method using such metal polishing slurry.

DETAILED DESCRIPTION OF THE INVENTION

Next, the present invention is described by referring to various embodiments.

[Metal Polishing Slurry]

The metal polishing slurry of the present invention is a polishing slurry used for the chemical mechanical polishing in the production of a semiconductor device, and contains a compound represented by the following general formula (1), an oxidizing agent, and an organic acid.

Next, each component is described in detail. It is to be noted that each component constituting the metal polishing slurry of the present invention may either comprise a single compound or two or more compounds.

In the present invention, the term "metal polishing slurry" is not only limited to the metal polishing slurry having the composition (or concentration) actually used in the polishing, but unless otherwise noted, the term "metal polishing slurry" also includes the concentrated polishing slurry which is to be diluted as desired before its actual use. The concentrate is diluted with water or an aqueous solution before its use for the polishing to a volume in the range of 1 to 20 times its original volume.

[Compound Represented by the General Formula (1)]

The metal polishing slurry of the present invention contains the compound represented by the general formula (1):

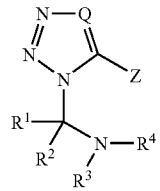

General formula (1)

wherein Q represents nitrogen atom or $CR^5$, Z represents hydrogen atom, a halogen atom, an aliphatic hydrocarbon group, an aryl group, a heterocyclic group, carboxyl group, a carbamoyl group, an acylamino group, amino group, or cyano group, $R^1$ and $R^2$ independently represent hydrogen atom, an aliphatic hydrocarbon group, an aryl group, or a heterocyclic group, $R^3$ and $R^4$ independently represent hydrogen atom, an alkyl group having carboxyl group, an alkyl group having hydroxyl group, or an alkyl group having tertiary amino group, or an alkyl group, and $R^5$ represents hydrogen atom, a halogen atom, an aliphatic hydrocarbon group, an aryl group, a heterocyclic group, carboxyl group, a carbamoyl group, an acylamino group, or cyano group, with the proviso that $R^1$ and $R^2$ or $R^3$ and $R^4$ may together represent a cyclic group.

In the general formula (1), Q represents nitrogen atom or $CR^5$. $R^5$ may represent a halogen atom such as fluorine atom, chlorine atom, bromine atom, or iodine atom. $R^5$ may also represent an aliphatic hydrocarbon group such as an optionally substituted linear, branched, or cyclic alkyl group containing 1 to 30 carbon atoms, and more preferably 1 to 10 carbon atoms. Examples of the optionally substituted linear or branched alkyl group include methyl, ethyl, n-propyl, isopropyl, t-butyl, n-octyl, eicosyl, 2-chloromethyl, 2-bromomethyl, hydroxymethyl, 2-hydroxyethyl, 2-cyanoethyl, and 2-ethylhexyl groups. Examples of the cyclic alkyl group include optionally substituted cycloalkyl groups such as cyclohexyl, cyclopentyl, and 4-n-dodecylcyclohexyl groups. Examples of the aryl group include an optionally substituted aryl group containing 6 to 30 carbon atoms, and preferably 6 to 15 carbon atoms such as phenyl, p-tolyl, naphthyl, m-chlorophenyl, and o-hexadecanoylaminophenyl groups. Examples of the heterocyclic group include a monovalent group which is an optionally substituted five or six-membered aromatic or non-aromatic heterocyclic compound from which one hydrogen atom has been removed, and it may contain a fused ring. Exemplary heterocyclic groups include monovalent groups corresponding to pyridine, pyrazine, pyridazine, pyrimidine, triazine, quinoline, isoquinoline, quinazoline, cinnoline, phthalazine, quinoxaline, pyrrole, indole, furan, benzofuran, thiophene, benzothiophene, pyrazole, imidazole, benzimidazole, triazole, oxazole, benzoxazole, thiazole, benzothiazole, isothiazole, benzisothiazole, thiadiazole, isoxazole, benzisoxazole, pyrrolidine, piperidine, piperazine, imidazolidine, and thiazoline which are not limited by the position of the substitution. Examples of the carbamoyl group include an optionally substituted carbamoyl group containing 1 to 30 carbon atoms, and preferably 1 to 10 carbon atoms such as carbamoyl, N-methylcarbamoyl, N,N-dimethylcarbamoyl, N,N-di-n-octylcarbamoyl, and N-(methylsulfonyl) carbamoyl group. Examples of the acylamino group include formylamino group, an optionally substituted alkyl carbonylamino group containing 1 to 30 carbon atoms, and preferably 1 to 10 carbon atoms, and an optionally substituted aryl carbonylamino group containing 6 to 30 carbon atoms, and preferably 1 to 10 carbon atoms, such as formylamino, acetylamino, pivaloylamino, lauroylamino, benzoylamino, and 3,4,5-tri-n-octyloxyphenylcarbonylamino group.

In view of simultaneously realizing the high polishing speed and the reduced dishing at a high efficiency, Q in the general formula (1) is preferably nitrogen atom or $CR^5$ wherein $R^5$ is hydrogen atom, a substituted alkyl group containing 1 to 4 carbon atoms (such as hydroxymethyl group, 2-hydroxyethyl group, or 2-carboxyethyl group), phenyl, pyridine, carbamoyl, N-methylcarbamoyl, or N,N-dimethylcarbamoyl group.

Q in the general formula (1) is more preferably nitrogen atom.

$R^1$ and $R^2$ in the general formula (1) are independently hydrogen atom, an aliphatic hydrocarbon group, an aryl group, or a heterocyclic group. Examples of the aliphatic hydrocarbon group include an optionally substituted linear, branched, or cyclic alkyl group containing 1 to 30 carbon atoms, and preferably 1 to 10 carbon atoms. Exemplary optionally substituted linear or branched alkyl groups include methyl, ethyl, n-propyl, isopropyl, t-butyl, n-octyl, eicosyl, 2-chloroethyl, 2-cyanoethyl, and 2-ethylhexyl groups. Examples of the cyclic alkyl group include optionally substituted cycloalkyl groups such as cyclohexyl, cyclopentyl, and 4-n-dodecylcyclohexyl groups. Examples of the aryl group include an optionally substituted aryl group containing 6 to 30 carbon atoms, and preferably 6 to 15 carbon atoms such as phenyl, p-tolyl, naphthyl, m-chlorophenyl, and o-hexadecanoylaminophenyl groups. Examples of the heterocyclic group include a monovalent group which is an optionally substituted five or six-membered aromatic or non-aromatic heterocyclic compound from which one hydrogen atom has been removed, and it may contain a fused ring. Exemplary heterocyclic groups include monovalent groups corresponding to pyridine, pyrazine, pyridazine, pyrimidine, triazine, quinoline, isoquinoline, quinazoline, cinnoline, phthalazine, quinoxaline, pyrrole, indole, furan, benzofuran, thiophene, benzo thiophene, pyrazole, imidazole, benzimidazole, triazole, oxazole, benzoxazole, thiazole, benzothiazole, isothiazole, benzisothiazole, thiadiazole, isoxazole, benzisoxazole, pyrrolidine, piperidine, piperazine, imidazolidine, or thiazoline which is not limited by the position of the substitution.

In view of simultaneously realizing the high polishing speed and the reduced dishing at a high efficiency, $R^1$ and $R^2$ in the general formula (1) are hydrogen atom or an optionally substituted alkyl group containing 1 to 4 carbon atoms (such as methyl, ethyl, n-propyl, isopropyl, t-butyl, or 2-hydroxyethyl).

More preferably, $R^1$ and $R^2$ in the general formula (1) are hydrogen atom.

$R^3$ and $R^4$ in the general formula (1) are independently hydrogen atom, an alkyl group having carboxyl group, an alkyl group having hydroxyl group, an alkyl group having a tertiary amino group, or an alkyl group. Examples of the alkyl group having carboxyl group include carboxymethyl group, carboxyethyl group, and carboxypropyl group. Examples of the alkyl group having hydroxyl group include hydroxylmethyl group, hydroxyethyl group, 2-hydroxypropyl group, and 3-hydroxypropyl group. Examples of the alkyl group having a tertiary amino group include N,N-dimethylaminoethyl group and N,N-diethylaminoethyl group. Examples of the alkyl group include a linear, branched, or cyclic alkyl group containing 1 to 30 carbon atoms, and preferably 1 to 10 carbon atoms. Examples of the optionally substituted linear or branched alkyl group include methyl, ethyl, n-propyl, isopropyl, t-butyl, and n-octyl group, and examples of the cyclic alkyl group include optionally substituted cycloalkyl groups such as cyclohexyl, cyclopentyl, and 4-n-dodecylcyclohexyl group.

Preferably, $R^3$ and $R^4$ in the general formula (1) are independently hydrogen atom or a linear, branched, or cyclic alkyl group having hydroxyl group, and more preferably, the one containing 1 to 4 carbon atoms such as hydroxymethyl, 2-hydroxyethyl, or 3-hydroxypropyl.

More preferably, $R^3$ and $R^4$ in the general formula (1) are 2-hydroxyethyl.

In general formula (1), Z may represent a halogen atom, and exemplary such halogen atoms include fluorine atom, chlorine atom, bromine atom, and iodine atom. Z may also represent an aliphatic hydrocarbon group, and exemplary such aliphatic hydrocarbon groups include an optionally substituted linear, branched, or cyclic alkyl group containing 1 to 30 carbon atoms, and preferably 1 to 10 carbon atoms. Examples of the optionally substituted linear or branched alkyl group include methyl, ethyl, n-propyl, isopropyl, t-butyl, n-octyl, eicosyl, 2-chloromethyl, 2-bromomethyl, hydroxymethyl, 2-hydroxyethyl, 2-cyanoethyl, and 2-ethylhexyl. Exemplary cyclic alkyl groups include optionally substituted cycloalkyl groups such as cyclohexyl, cyclopentyl, and 4-n-dodecylcyclohexyl groups. Examples of the aryl group include an optionally substituted aryl group containing 6 to 30 carbon atoms, and preferably 6 to 15 carbon atoms such as phenyl, p-tolyl, naphthyl, m-chlorophenyl, and o-hexadecanoylaminophenyl groups. Examples of the heterocyclic group include a monovalent group which is an optionally substituted five or six-membered aromatic or non-aromatic heterocyclic compound from which one hydrogen atom has been removed, and it may contain a fused ring. Exemplary heterocyclic groups include monovalent groups corresponding to pyridine, pyrazine, pyridazine, pyrimidine, triazine, quinoline, isoquinoline, quinazoline, cinnoline, phthalazine, quinoxaline, pyrrole, indole, furan, benzofuran, thiophene, benzothiophene, pyrazole, imidazole, benzimidazole, triazole, oxazole, benzoxazole, thiazole, benzothiazole, isothiazole, benzisothiazole, thiadiazole, isoxazole, benzisoxazole, pyrrolidine, piperidine, piperazine, imidazolidine, and thiazoline which is not limited by the position of the substitution. Examples of the carbamoyl group include an optionally substituted carbamoyl group containing 1 to 30 carbon atoms, and preferably 1 to 10 carbon atoms such as carbamoyl, N-methylcarbamoyl, N,N-dimethylcarbamoyl, N,N-di-n-octylcarbamoyl, N-(methylsulfonyl), or carbamoyl group. Examples of the acylamino group include formylamino group, an optionally substituted alkyl carbonylamino group containing 1 to 30 carbon atoms, and preferably 1 to 15 carbon atoms, and an optionally substituted aryl carbonylamino group containing 6 to 30 carbon atoms, such as formylamino, acetylamino, pivaloylamino, lauroylamino, benzoylamino, and 3,4,5-tri-n-octyloxyphenylcarbonylamino group.

In view of simultaneously realizing the high polishing speed and the reduced dishing at a high efficiency, Z in the general formula (1) is preferably hydrogen atom, amino group, an optionally substituted alkyl group containing 1 to 4 carbon atoms (such as methyl, ethyl, n-propyl, isopropyl, t-butyl, or 2-hydroxyethyl), phenyl group, pyridine, carbamoyl, N-methylcarbamoyl, or N,N-dimethylcarbamoyl.

More preferably, Z in the general formula (1) is hydrogen atom or amino group.

$R^1$ and $R^2$, or $R^3$ and $R^4$ in the general formula (1) may together form a cyclic group, which may be a non-aromatic or aromatic cyclic hydrocarbon group or heterocyclic group, and preferably a 5 to 8-membered ring.

The compound represented by the general formula (1) may preferably have a molecular weight of 100 to 1000, and more preferably 120 to 500. The compound having such molecular weight is preferable in view of the high solubility, and simultaneous realization of the high polishing speed and the reduced dishing at a high efficiency.

The compound represented by the general formula (1) is not limited for its production process, and may be synthesized by the method known in the art such as JP 51-98276 A. A commercially available product may also be used.

Examples of the compound represented by the general formula (1) are shown below. The compound, however, is not limited to these examples.

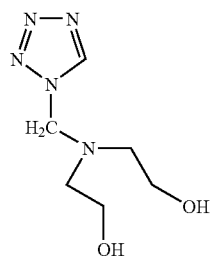
A-1

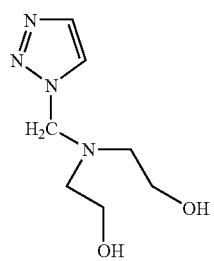
A-2

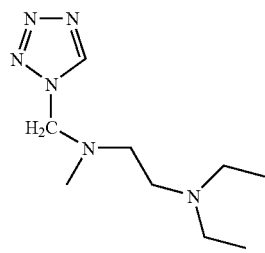
A-3

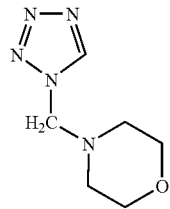
A-4

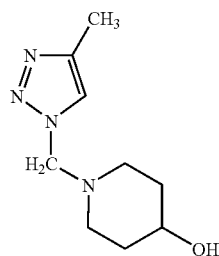
A-5

-continued

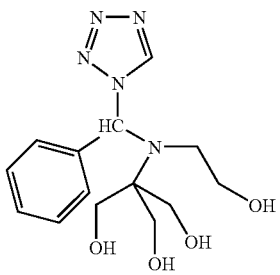
A-6

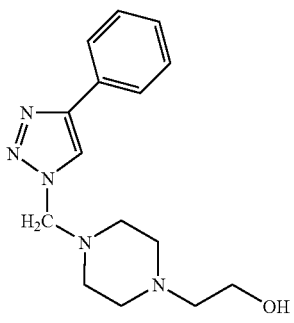
A-7

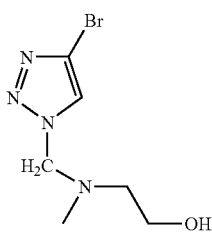
A-8

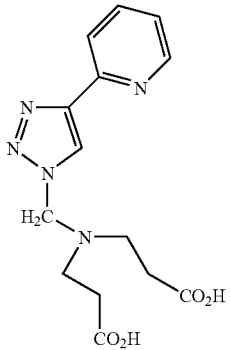
A-9

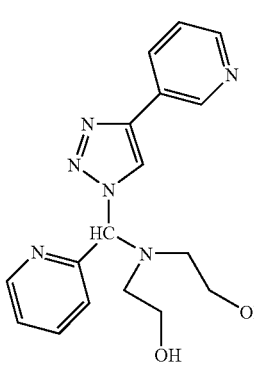
A-10

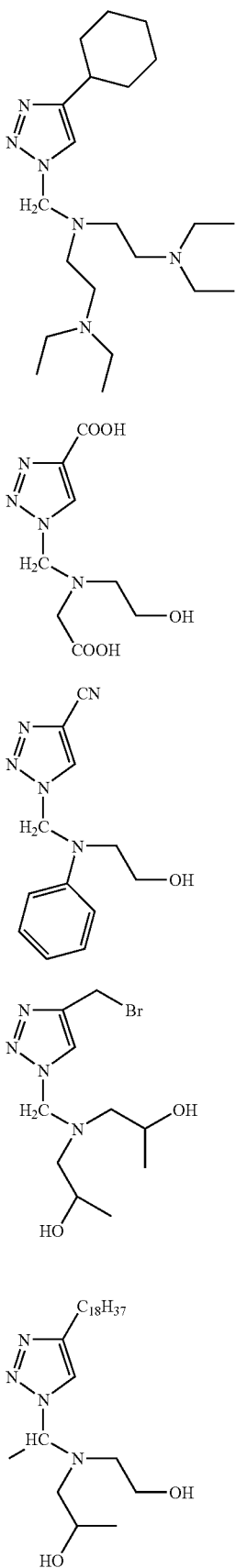

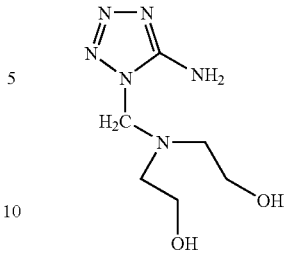

The compound represented by the general formula (1) may be used in the present invention at a total amount of $1\times10^{-8}$ to $1\times10^{-1}$ mol, preferably at $1\times10^{-7}$ to $1\times10^{-2}$ mol, and more preferably at $1\times10^{-6}$ to $1\times10^{-3}$ mol in relation to 1 L of the metal polishing slurry actually used in the polishing. Incorporation at an amount in such range is preferable in view of the superior polishing speed and reduced dishing.

[Oxidizing Agent]

The metal polishing slurry of the present invention contains a compound which is capable of oxidizing the metal to be polished (oxidizing agent). The oxidizing agent is not particularly limited as long as it is a compound which is capable of oxidizing the metal to be polished, and exemplary such compounds include hydrogen peroxide, peroxides, nitrate salts, iodate salts, periodate salts, hypochlorite salts, chlorite salts, chlorate salts, perchlorate salts, persulfate salts, bichromate salts, permanganate salts, ozone water, silver (II) salts, and iron (III) salts. Among these, the preferred is hydrogen peroxide in view of the high polishing speed and the reduced dishing, and these compounds may be used alone or in combination of two or more.

The oxidizing agent is preferably incorporated at a total amount of 0.003 mol to 8 mol, more preferably at 0.03 mol to 6 mol, and most preferably at 0.1 mol to 4 mol in 1 L of the metal polishing slurry actually used in the polishing. Incorporation of the oxidizing agent at an amount of at least 0.003 mol is preferable for sufficient metal oxidization and high polishing speed, while incorporation at an amount of up to 8 mol is preferable for preventing roughening of the polishing surface.

[Organic Acid]

The metal polishing slurry of the present invention contains an organic acid. The term "organic acid" used in this context is not the oxidizing agent of the metal but the one which is added for its function of facilitating the oxidation, pH adjustment, and buffering. The organic acid is a compound having a structure which is different from the oxidizing agent added for the metal oxidation as described above, and the organic acid does not include the acid which functions as the oxidizing agent.

Exemplary organic acids include an amino acid which may be used alone or in combination of two or more.

The amino acid used is preferably a water soluble amino acid, and more preferably, the one selected from the group consisting of glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cysteic acid, L-aspartic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamin, angiotensin I, angiotensin II, and antipain.

The organic acid other than the amino acid is preferably the one which is soluble in water selected from the group consisting of formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyliminodiacetic acid, iminodiacetic acid, acetoamidoiminodiacetic acid, nitrilotripropanoic acid, nitrilotrimethylphosphonic acid, dihydroxyethylglycine, tricine, and salts such as ammonium salts and alkali metal salts of these acids, sulfuric acid, nitric acid, ammonia, ammoniums salts, and their mixture.

Of the organic acids as described above, the preferred are glycine, iminodiacetic acid, methyliminodiacetic acid, n-methylglycine, nitrilotripropanoic acid, hydroxyethyliminodiacetic acid, β-alanine, glycylglycine, dihydroxyethylglycine, acetoamidoiminodiacetic acid, and tricine in view of effectively suppressing the etching speed while maintaining the practical CMP speed. These organic acids may be synthesized by the method commonly used in the art or purchased from a commercial source.

The organic acid is preferably used at an amount of 0.005 to 0.5 mol, preferably at 0.01 to 0.3 mol, and more preferably at 0.05 to 0.3 mol in 1 L of the metal polishing slurry actually used in the polishing. Incorporation at an amount of at least 0.01 mol is preferable for improving the polishing speed while incorporation at an amount of up to 0.03 mol is preferable to prevent increase in the dishing.

[Surfactant Represented by General Formula (2)]

The metal polishing slurry of the present invention may preferably contain a surfactant represented by the following general formula (2):

$$R—Ar—O—Ar—SO_3^-M^+ \quad \text{General formula (2)}$$

for the purpose of reducing the dishing.

In the general formula (2), R represents a linear or branched alkyl group preferably containing 8 to 20, more preferably 10 to 20, and most preferably 12 to 20 carbon atoms. The alkyl group represented by R may be either a linear or a branched alkyl group, and preferably a linear alkyl group. Examples of such alkyl group R include decyl group, undecyl group, dodecyl group, tridecyl group, tetradecyl group, pentadecyl group, hexadecyl group, heptadecyl group, octadecyl group, nonadecyl group, and eicosyl group, and the preferred are dodecyl group, tridecyl group, tetradecyl group, pentadecyl group, octadecyl group, nonadecyl group, and eicosyl group in view of superior suppression of the dishing.

In the general formula (2), Ar represents an aryl group. Exemplary aryl groups represented by Ar include phenyl group, naphthyl group, anthryl group, and phenanthryl group, and the preferred is phenyl group in view of superior suppression of the dishing. The two Ar groups in the general formula (2) may be either the same or different, and preferably the same.

The alkyl group or the aryl group may be further substituted with a substituent. Exemplary such substituents include halogen atom (fluorine atom, chlorine atom, bromine atom, or iodine atom), alkyl group (a linear, branched, or cyclic alkyl group which may be a polycyclic alkyl group such as a bicycloalkyl group and which may include an active methine group), alkenyl group, alkynyl group, aryl group, heterocyclic group (which is not limited for the position of the substitution), acyl group, alkoxycarbonyl group, aryloxycarbonyl group, heterocyclic oxycarbonyl group, carbamoyl group (which may be substituted as in the case of N-hydroxycarbamoyl group, N-acylcarbamoyl group, N-sulfonylcarbamoyl group, N-carbamoylcarbamoyl group, thiocarbamoyl group, or N-sulfamoylcarbamoyl group), carbazoyl group, carboxy group or its salt, oxalyl group, oxamoyl group, cyano group, carbonimidyl group, formyl group, hydroxy group, alkoxy group (including the group containing repetition of ethylenoxy group or propylenoxy group), aryloxy group, heterocyclic oxy group, acyloxy group, (alkoxy or aryloxy) carbonyloxy group, carbamoyloxy group, sulfonyloxy group, amino group, (alkyl, aryl, or heterocyclic) amino group, acylamino group, sulfonamide group, ureido group, thioureido group, N-hydroxyureido group, imide group, (alkoxy or aryloxy) carbonylamino group, sulfamoylamino group, semicarbazide group, thiosemicarbazide group, hydrazino group, ammonio group, oxamoylamino group, N-(alkyl or aryl) sulfonylureido group, N-acylureido group, N-acylsulfamoylamino group, hydroxy amino group, nitro group, heterocyclic group containing quaternarized nitrogen atom (for example, pyridinio group, imidazolio group, quinolinio group, or isoquinolinio group), isocyano group, imino group, mercapto group, (alkyl, aryl, or heterocyclic) thio group, (alkyl, aryl, or heterocyclic) dithio group, (alkyl or aryl) sulfonyl group, (alkyl or aryl) sulfinyl group, sulfo group, sulfamoyl group (which may be substituted with a substituent as in the case of N-acylsulfamoyl group or N-sulfonylsulfamoyl group), phosphino group, phosphinyl group, phosphinyloxy group, phosphinylamino group, and silyl group. The preferred are alkyl group and sulfo group in view of simultaneously realizing the high polishing speed and the reduced dishing at a high efficiency.

In the general formula (2), $M^+$ represents hydrogen ion, alkali metal ion, or ammonium ion.

Examples of the preferable alkali metal ion represented by $M^+$ include sodium ion and potassium ion, and the preferred is sodium ion.

When the $M^+$ is ammonium ion ($NH_4^+$), the ammonium ion may also be the one having its hydrogen atom substituted with an alkyl group such as tetramethyl ammonium ion or tetraethyl ammonium ion.

Preferably, $M^+$ is hydrogen ion or ammonium ion, and more preferably hydrogen ion.

Exemplary surfactants represented by the general formula (2) include alkyl diphenyl ether disulfonic acid such as dodecyl diphenyl ether disulfonic acid, tetradecyl diphenyl ether disulfonic acid, hexadecyl diphenyl ether disulfonic acid, octadecyl diphenyl ether disulfonic acid, and eicosyl diphenyl ether disulfonic acid, or their salt; alkyl diphenyl ether monosulfonic acid such as dodecyl diphenyl ether monosulfonic acid, tetradecyl diphenyl ether monosulfonic acid, hexadecyl diphenyl ether monosulfonic acid, octadecyl monophenyl ether disulfonic acid, and eicosyl monophenyl ether disulfonic acid, or their salt; and dodecyl dinaphthyl ether disulfonic acid, dodecyl dianthryl ether disulfonic acid, dodecyl dinaphthyl ether monosulfonic acid, dodecyl dianthryl ether monosulfonic acid, or their salts.

Among these, the surfactant represented by the general formula (2) preferably comprises an alkyl diphenyl ether disulfonic acid or its salt, and the surfactant is preferably a mixture of an alkyl diphenyl ether disulfonic acid and an alkyl diphenyl ether monosulfonic acid or a mixture of their salts in view of reducing the dishing.

In the case of such mixture, the mixture preferably contains at least 10% by mole, preferably at least 30% by mole, and more preferably at least 50% by mole of the alkyl diphenyl ether monosulfonic acid.

The surfactant represented by the general formula (2) is preferably used at an amount of 0.0001% by weight to 0.1% by weight, more preferably at 0.0005% by weight to 0.05% by weight, and most preferably at 0.001% by weight to 0.01% by weight in relation to the metal polishing slurry actually used in the polishing.

The method used for synthesizing the surfactant represented by the general formula (2) is not particularly limited, and use of a commercially available product is preferable.

Next, the surfactant and the hydrophilic polymer which can be used together with the surfactant represented by the general formula (2) incorporated in the metal polishing slurry of the present invention are described. In the present invention, the surfactant and the hydrophilic polymer as described below may be simultaneously incorporated with other components. Both the surfactant and the hydrophilic polymer have the function of reducing the contact angle of the surface to be polished, and this function facilitates consistent polishing.

In the present invention, the surfactant and the hydrophilic polymer as described below may be simultaneously incorporated with other components.

Examples of the anionic surfactant include carboxylate salt, sulfonate salt, sulfate salt, and phosphate salt.

Examples of the cationic surfactant include aliphatic amine salt, aliphatic quaternary ammonium salt, benzalkonium chloride salt, benzethonium chloride, pyridinium salt, and imidazolinium salt.

Examples of the amphoteric surfactant include carboxy betaine surfactants, aminocarboxylate salt, imidazolinium betaine, lecithin, and alkylamine oxide.

Examples of the non-ionic surfactant include ether surfactants, ether ester surfactants, ester surfactants, and nitrogen-containing surfactants.

Other examples include fluorosurfactants.

Exemplary hydrophilic polymers include polyglycols such as polyethylene glycol, polyvinyl alcohol, polyvinylprrolidone, olysaccharides such as alginic acid, polymers including a carboxylic acid such as polymethacrylic acid.

Among these, the preferred is use of an acid or its ammonium salt in view of preventing the contamination by an alkaline metal, alkaline earth metal, or halide. Of the compounds as mentioned above, the preferred are cyclohexanol, poly(ammonium acrylate), polyvinyl alcohol, succinic amide, polyvinylpyrrolidone, polyethylene glycol, and polyoxyethylene polyoxypropylene block polymer.

The surfactant and the hydrophilic polymer may preferably have a weight average molecular weight of 500 to 100,000, and more preferably, 2,000 to 50,000.

The surfactant and/or the hydrophilic polymer other than the surfactant represented by the general formula (2) is preferably incorporated at a total content of 0.0001% by weight to 1.0% by weight, more preferably at 0.0005% by weight to 0.5% by weight, and most preferably at 0.001% by weight to 0.1% by weight in relation to 1 L of the metal polishing slurry actually used for polishing. Incorporation in such range is preferable for simultaneously realizing the high polishing speed and the reduced dishing.

[Abrasive]

Preferably, the metal polishing slurry of the present invention further comprises an abrasive for realizing excellent polishing effects.

Exemplary preferable abrasives include silica (e.g. precipitated silica, fumed silica, colloidal silica, and synthesized silica), ceria, alumina, titania, zirconia, germania, manganese oxide, silicon carbide, polystyrene, polyacryl, and polyterephthalate. Among these, use of fumed silica, colloidal silica, ceria, alumina, and titania is preferable, and use of the colloidal silica is most preferable in view of simultaneously realizing the high polishing speed and the reduced dishing which are the unique effects of the present invention.

The abrasive may preferably have an average particle size of 5 to 1000 nm, and more preferably 10 to 200 nm for effectively realizing the merits of the present invention.

The abrasive of the present invention may preferably comprise a colloidal silica having a primary particle size of 20 to 40 nm and an association degree of up to 2 (and such colloidal silica hereinafter also referred to as "predetermined colloidal silica"). Use of such colloidal silica is preferable for effective realization of the high polishing speed simultaneously with the reduced dishing.

The predetermined colloidal silica has a primary particle size of 20 nm to 40 nm, and preferably 20 nm to 30 nm. When the primary particle size of the colloidal silica particle is excessively low, the silica particles may clog the pores of the polishing pad and this may result in the reduced polishing speed. Use of the colloidal silica having a primary particle size of up to 40 nm is preferable in view of significantly reducing the dishing.

The term "primary particle size" of the colloidal silica particles used in the present invention means the particle size at 50% cumulative frequency in the particle size cumulative frequency curve showing the cumulative frequency of the particles having a particular diameter in relation to the particle diameter of the colloidal silica.

The particle size of the colloidal silica particle is an average particle diameter calculated from the particle size distribution obtained by dynamic light scattering method. An exemplary apparatus used for measuring the particle size distribution is LB-500 manufactured by Horiba.

The association degree is the value obtained by dividing diameter of the secondary particle produced by aggregation of the primary particles with the diameter of the primary particle (the diameter of the secondary particle/the diameter of the primary particle). Accordingly, when the abrasive has an average association degree of 1, the abrasive solely comprises monodispersed primary particles. The secondary particle size is determined by measuring diameter of at least two secondary particles in the picture image taken by an electron microscope and calculating the average.

The particular colloidal silica used in the present invention is preferably a colloidal silica having at least a part of the silicon atoms on its surface modified with aluminum atom. By using such colloidal silica having at least a part of its surface silicon atoms modified with aluminum atom, dishing can be further reduced.

In the present invention, "the colloidal silica having a part of its surface modified with aluminum atom" means that aluminum atoms are present on the surface of the colloidal silica at the site where the silicon atoms have a coordination number of 4. The state may be either such that a new surface where aluminum atom having a coordination number of 4 is immobilized is formed by the bonding of the aluminum atom having 4 oxygen atoms coordinated to the colloidal silica surface, or a new surface where the silicon atom which had been present on the surface was removed and replaced with the aluminum atom.

The colloidal silica used in producing the predetermined colloidal silica is preferably the one which has been obtained by hydrolysis of an alkoxysilane and which contains no impurity such as alkali metal atom in the interior of the particle. The colloidal silica produced by removing alkali from aqueous alkaline solution of silicic acid may also be used. Such colloidal silica, however, suffers from gradual dissolution of the alkaline metal remaining in the interior of the particles, and this may adversely affect the polishing performance. Accordingly, use of the colloidal silica obtained by the hydrolysis of an alkoxysilane is preferable for the starting material.

A preferable method used for obtaining the predetermined colloidal silica having the silicon atom on its surface modified with aluminum atom is a method in which an aluminate compound such as ammonium aluminate is added to the colloidal silica dispersion. In one method, a silica sol obtained by adding an alkaline aqueous solution of aluminate is heated at 80 to 250° C. for 0.5 to 20 hours, and the heated silica sol is contacted with a cation-exchange resin or with a cation-exchange resin and an anion-exchange resin. In another method, an acidic solution of silicic acid and an aqueous solution of an aluminum compound are added to a $SiO_2$-containing alkaline aqueous solution or a $SiO_2$-containing aqueous solution of an alkaline metal hydroxide. In another method, an acidic silicate solution containing an aluminum compound is added to a $SiO_2$-containing alkaline aqueous solution or a $SiO_2$-containing aqueous solution of an alkaline metal hydroxide, and the resulting alkaline silica sol containing the aluminum compound is treated by a cation-exchange resin for dealkalization. These methods are described in detail in JP 3463328B and JP 63-123807A, and their disclosure can be applied to the present invention.

In another method, an aluminum alkoxide may be added to the dispersion of colloidal silica. The aluminum alkoxide used in this method is not particularly limited while preferable examples include aluminum isopropoxide, aluminum butoxide, aluminum methoxide, and aluminum ethoxide, and the most preferred is use of aluminum isopropoxide or aluminum butoxide.

The predetermined colloidal silica has excellent dispersibility even in acidic conditions since the aluminosilicate sites formed by the reaction between the 4-coordinated aluminate ion and the silanol group on the surface of the colloidal silica fixes negative charge and gives high zeta potential to the particle. Accordingly, in the predetermined colloidal silica produced by the method as described above, it is important that the aluminum atom is present in the state coordinated by 4 oxygen atoms.

Such structure, namely, modification by the silicon atom and the aluminum atom on the surface of the colloidal silica can be readily confirmed by measuring zeta potential of the abrasive.

Amount of the aluminum atom used for modifying the silicon atom on the surface of the colloidal silica may be adequately regulated by controlling the amount (concentration) of the aluminate compound or the aluminum alkoxide added to the colloidal silica dispersion.

Amount of the aluminum atom introduced to the surface of the colloidal silica (number of aluminum atoms/number of silicon atom sites on the surface) can be estimated from the surface area calculated from the diameter of the colloidal silica, specific weight of the colloidal silica (2.2), and number of the silanol group per unit surface area (5 to 8/nm$^2$) by assuming that 100% of the consumed aluminum-based compound had been involved in the reaction (the amount of the consumed aluminum-based compound being calculated from subtracting the amount of the unreacted aluminum-based compound remaining after the reaction from the amount of the aluminum-based compound that had originally been added to the dispersion). Actually, the amount of the aluminum atom introduced to the surface of the colloidal silica is measured by conducting elementary analysis of the resulting predetermined colloidal silica itself and assuming that the aluminum is not present in the interior of the particle and the aluminum is consistently spread over the surface, and using the ratio of the surface area to the specific weight of the colloidal silica, and the number of silanol groups per unit surface area.

In an exemplary method of producing the colloidal silica having at least a part of the surface silicon atom modified with the aluminum, a dispersion having 5 to 25% by weight of the colloidal silica dispersed in water is first prepared, and a pH adjusting agent is then added to the dispersion to adjust the pH to 5 to 11, and with stirring, 15.9 g of an aqueous solution of sodium aluminate having an $Al_2O_3$ concentration of 3.6% by weight and a $Na_2O/Al_2O_3$ molar ratio of 1.50 is gradually added in several minutes, and the stirring is continued for another 0.5 hours. The solvent is then removed to obtain the predetermined colloidal silica.

The abrasive is preferably incorporated at an amount of 0.01 to 20% by weight, and more preferably at 0.05 to 5% by weight in relation to the total weight of the metal polishing slurry actually used in the polishing. Incorporation of at least 0.01% by weight is preferable to efficiently improve the polishing speed and reduce the variation of the polishing speed in the wafer surface, and incorporation of up to 20% by weight is preferable in view of the saturation of the polishing speed by CMP.

The predetermined colloidal silica is preferably incorporated in the metal polishing slurry of the present invention at an amount of up to 1% by weight, more preferably at least 0.01% by weight and up to 0.9% by weight, and most preferably at least 0.01% by weight and up to 0.7% by weight in relation to the total weight of the metal polishing slurry in view of reducing the dishing and the incidence of scratches.

When no abrasive is used in the metal polishing slurry or when the abrasive is incorporated at a concentration of less than 0.01% by weight, the pH is preferably adjusted to at least pH 3.5, and more preferably to at least pH 4.0 to thereby improve the polishing speed and the dishing properties. In this case, incorporation of a hydrophilic polymer such as polyacrylic acid as described above is preferable, and such hydrophilic polymer is preferably incorporated at an amount of 0.0001 to 5% by weight, and more preferably at 0.01 to 0.5% by weight in relation to the total weight of the metal polishing slurry.

The metal polishing slurry of the present invention may also contain an abrasive other than the predetermined colloidal silica at an amount that does not adversely affect the merits of the present invention.

In the abrasive incorporated in the metal polishing slurry of the present invention, the predetermined colloidal silica preferably constitutes at least 50% by weight, and more preferably at least 80% by weight. The predetermined colloidal silica may also constitute all of the abrasive incorporated in the metal polishing slurry.

Preferably, the abrasive other than the predetermined colloidal silica has a particle size at least equivalent to the predetermined colloidal silica to twice the size of the predetermined colloidal silica.

[Other Components]

The metal polishing slurry of the present invention may also contain other components such as a pH adjusting agent, and other additives.

[pH Controlling Agent]

The metal polishing slurry of the present invention may preferably contain an acidic agent, an alkaline agent, or a buffering agent for adjusting the pH to the predetermined pH range.

Exemplary acidic agents include inorganic acids such as sulfuric acid, nitric acid, boric acid, and phosphoric acid. The preferred is sulfuric acid.

Exemplary alkaline agents and buffering agents include non-metallic alkaline agents, for example, ammonia; organic ammonium hydroxides such as ammonium hydroxide or tetramethylammonium hydroxide; alkanol amines such as diethanolamine, triethanolamine, or triisopropanol amine; alkali metal hydroxides such as sodium hydroxide, potassium hydroxide, or lithium hydroxide; carbonate such as sodium carbonate; phosphate such as trisodium phosphate: borate; tetraborate; hydroxybenzoate and the like.

Preferred alkaline agents include ammonium hydroxide, potassium hydroxide, lithium hydroxide, and tetramethylammonium hydroxide.

The pH controlling agent may be incorporated at an amount capable of maintaining the pH to within preferable range. Preferably, the pH controlling agent is used at 0.0001 mol to 1.0 mol, and more preferably at 0.003 mol to 0.5 mol in relation to 1 L of the metal polishing slurry actually used in the polishing.

The pH of the metal polishing slurry actually used for the polishing is preferably in the range of from 3 to 12, more preferably 4 to 9, and still more preferably 5 to 8. The metal polishing slurry is adjusted to such pH range by the use of such acidic agent, alkaline agent, or buffering agent.

[Chelating Agent]

The metal polishing slurry according to the present invention may contain a chelating agent (i.e. water softener), if necessary, for reducing an adverse effect caused by the contaminant polyvalent metal ions.

The chelating agent used may be a versatile water softener which prevents precipitation of calcium and magnesium or related compounds thereof, and if necessary, a combination of two or more the chelating agents may be used. Exemplary chelating agents include nitrilotriacetic acid, diethylenetriamine pentaacetic acid, ethylenediamine tetraacetic acid, N,N,N-trimethylene phosphonic acid, ethylenediamine-N,N,N',N'-tetramethylenesulfonic acid, transcyclohexanediamine tetraacetic acid, 1,2-diaminopropane tetraacetic acid, glycol ether diamine tetraacetic acid, ethylenediamine o-hydroxyphenyl acetic acid, ethylenediamine disuccinic acid (SS body), N-(2-ethyl carboxylate)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxy benzyl)ethylenediamine-N,N'-diacetic acid, and 1,2-dihydroxybenzene-4,6-diphosphonic acid. The agent may be used alone, or in combination of two or more.

The chelating agent may be used at an amount sufficient for capping the metal ion such as the polyvalent metal ion contaminant. For example, the chelating agent may be used at 0.0003 mol to 0.07 mol in relation to 1 L of the metal polishing slurry actually used for polishing.

The metal polishing slurry of the present invention is not particularly limited for its production method. In an exemplary method, the compound represented by the general formula (1), the oxidizing agent, the organic acid, and the optional components such as abrasive, the surfactant represented by the general formula (2), the surfactant and hydrophilic polymer which can be used together with the surfactant represented by the general formula (2), and other additives, and water may be thoroughly stirred by using an agitator such as a blender. In this method, each component may be adjusted to the predetermined pH before the mixing, or the pH may be adjusted after the mixing.

Alternatively, the metal polishing slurry of the present invention may be prepared in two components (A) and (B) so that the component (A) includes the oxidizing agent and the component (B) includes the compound represented by the general formula (1), the organic acid, and the optional components such as the abrasive.

[Chemical Mechanical Polishing]

The chemical mechanical polishing method of the present invention is a polishing method which involves supplying the metal polishing slurry of the present invention to the polishing pad on the platen, and bringing the polishing pad in contact with the surface to be polished, and carrying out polishing by moving the surface to be polished and the polishing pad relatively to each other.

Next, the chemical mechanical polishing method is described in detail.

[Polishing Apparatus]

First the apparatus which can be used in conducting the polishing method of the present invention is described.

The polishing apparatus used in the present invention may be an ordinary polisher having a holder which holds the subject to be polished (such as semiconductor substrate) having a surface to be polished and a platen (provided with a motor whose number of revolution is variable or the like) onto which a polishing pad is attached. An exemplary polishing apparatus is FREX300 manufactured by Ebara Corporation.

[Polishing Pressure]

In the polishing method of the present invention, the suitable polishing pressure, namely, contact pressure between the surface to be polished and polishing pad depends on the apparatus used for the polishing and the composition of the metal polishing slurry. However, the polishing is preferably accomplished at a pressure in the range of from 3,000 to 250,000 Pa, and more preferably 6,500 to 14,000 Pa. Use of the polishing pressure within such range allows improvement of the uniformity throughout the wafer surface and the pattern flatness while maintaining high polishing speed.

[Rotation Speed of Polishing Platen]

Optimal rotation speed of the polishing platen in the polishing method of the present invention depends on the apparatus used for the polishing and the composition of the metal polishing slurry. However, the polishing is preferably conducted at a rotation speed in the range of 50 to 200 rpm, and more preferably at 60 to 150 rpm since use of the rotation speed within such range allows improvement of the uniformity throughout the wafer surface and the pattern flatness while maintaining high polishing speed.

The polishing head having the polishing pad attached thereto may also be rotated at a rotation speed within suitable range by considering the apparatus used for the polishing and the composition of the metal polishing slurry.

[Feeding of the Polishing Slurry]

In the present invention, the metal polishing slurry is continuously supplied to the polishing pad on the polishing platen with a pump during the polishing. While the amount of the polishing slurry supplied to the polishing pad is not limited, it is preferable that the surface of the polishing pad is steadily covered with the polishing slurry.

In the polishing method of the present invention, the polishing may be conducted after diluting the slurry concentrate with water or an aqueous solution. A typical method in such dilution is a method in which a pipe which feeds the metal polishing slurry concentrate and a pipe which feeds the water or the aqueous solution are joined so that the resulting metal polishing slurry which has been mixed and diluted could be supplied to the polishing pad as a slurry for actual use in the polishing. The mixing of the concentrate with the water or the aqueous solution may be accomplished, for example, by a method in which a pressure is applied to the fluids passing through narrow flow path so that they collide with each other to become mixed with each other; a method in which a filler such as glass tubing is packed in the pipe to repetitively split and integrate the liquid flow; or a method in which blades which are rotatable by power are provided in the pipe.

Another method which may be used for the dilution is a method in which a pipe for supplying the metal polishing slurry and a pipe for supplying the water or the aqueous solution are provided, and predetermined amount of the fluids are supplied from each pipe to the polishing pad so as to carry out the mixing of the two fluids and the polishing by the relative movement between the polishing pad and the surface to be polished.

In another method which may be used in the present invention, a predetermined amount of the metal polishing slurry concentrate and the water or the aqueous solution are added to a single vessel so that they are mixed and diluted to the predetermined concentration, and the slurry after such mixing is supplied to the polishing pad to thereby carry out the polishing.

In another polishing method, the ingredients to be contained in the metal polishing slurry may be separated into at least two components, and at the time of their use, the two or more components may be diluted with water or an aqueous solution and supplied to the polishing pad. In such case, the ingredients are preferably fed by separating into the component including the oxidizing agent and the component including the organic acid of the present invention.

For example, the oxidizer may be included in component (A), and an organic acid, an additives, the surfactant, an abrasive, and water may be included in component (B), and these components (A) and (B) may be diluted before the use with water or an aqueous solution. In such case, three pipes are required to separately feed the component (A), the component (B), and the water or the aqueous solution. The dilution by the mixing may be carried out by joining the three pipes in the downstream and feeding the slurry from the integrated pipe to the polishing pad so that the mixing takes place in the integrated part of the pipe. In this case, two pipes may be joined before joining the remaining pipe, and more specifically, the component containing the less soluble additives is initially mixed with other components to thereby ensure sufficient distance and time for the mixing. The pipe of the water or the aqueous solution may be joined in the downstream.

Alternatively, the three pipes may be directly guided to the polishing pad so that the mixing is accomplished by the relative movement of the polishing pad and the surface to be polished. Still further, the three components may be mixed in a single vessel, and the mixed metal polishing slurry may be supplied to the polishing pad.

[Amount of the Polishing Slurry]

In the polishing method of the present invention, the metal polishing slurry is preferably supplied to the polishing platen at 50 to 500 ml/min, and more preferably at 100 to 300 ml/min.

[Polishing Pad]

The polishing pad used in the polishing method of the present invention is not particularly limited, and it may be a pad having a non-foamed structure or a pad having a foamed structure. The pad having a non-foamed structure typically comprises a hard synthetic resin bulk material such as a plastic plate. The pad having such foamed structure is categorized into three types, namely, those made of a closed-cell foam (dry expanded), those made of an interconnected-cell foam (wet expanded), and those made of a two-layer composite (laminated). Of these, pads made of a two-layer composite (laminated) are especially preferred. The foaming may be uniform or non-uniform.

The polishing pad used in the polishing method of the present invention may further contain an abrasive used in the polishing (for example, ceria, silica, alumina, or resin). The polishing pad may be either a soft or a hard pad, and in the case of a laminated polishing pad, the pad may comprise layers each having different hardness. Preferable materials used for the polishing pad include nonwoven fabric, synthetic leather, polyamide, polyurethane, polyester, and polycarbonate. It may have grid of grooves, holes, or concentric or spiral grooves formed in the surface which contacts the surface to be polished.

Next, the subject to be polished (substrate, wafer) in the polishing method of the present invention is described.

[Metal Interconnect Material]

The subject to be polished in the present invention is preferably a substrate (wafer) having interconnects of copper or a copper alloy. Among the copper alloys, the copper alloy including silver is suitable as the metal interconnect material. The content of silver in the copper alloy is preferably up to 10% by weight, more preferably up to 1% by weight, and more preferably in the range of 0.00001 to 0.1% by weight in view of fully exerting the advantages of the metal polishing slurry of the present invention.

[Interconnect Width]

The subject to be polished in the present invention may preferably have an interconnect, for example, in DRAM devices, of up to 0.15 μm, more preferably up to 0.10 μm, and even more preferably up to 0.08 μm in half pitch.

In MPU devices, the half pitch is preferably up to 0.12 μm, more preferably up to 0.09 μm, and even more preferably up to 0.07 μm.

The metal polishing slurry of the invention produces a particularly good result on those having such interconnects.

[Metallic Barrier Material]

In the subject to be polished in the present invention, a barrier layer is provided between the copper interconnects and the insulation film (including the interlayer dielectric film) for preventing the diffusion of copper. The barrier layer is preferably formed from a low-resistance metal material such as TiN, TiW, Ta, TaN, W, or WN, and more preferably, from Ta or TaN.

As described above, the metal polishing slurry of the invention can be used at a high polishing speed. When the polishing is carried out by using the metal polishing slurry of the present invention, dishing can be reduced and the planarity of the substrate can be improved, thereby making it possible to minimize the occurrence of defects such as corrosion, scratching, thinning, and erosion in the LSI.

EXAMPLES

Next, the present invention is described in further detail by referring to Synthetic Examples and Examples, which by no means limit the scope of the present invention, and the materials, the amount, the proportion, and the method and the procedures described these Synthetic Examples and Examples may be adequately changed within the scope of the invention.

First, an exemplary synthesis of the compound represented by the general formula (1) is described. Other compounds were synthesized by referring to this procedure.

Synthetic Example 1

Synthesis of Exemplary Compound A-1

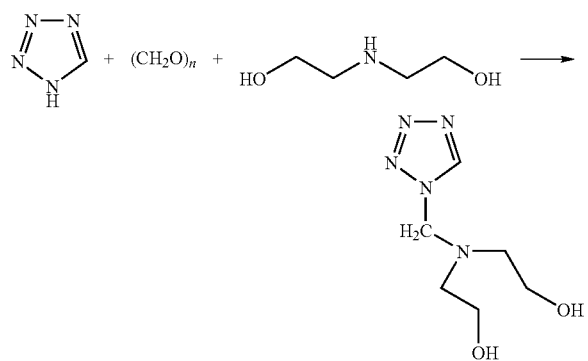

1H-tetrazole (I-A) (1.05 g, manufactured by Tokyo Chemical Industry Co., Ltd.), paraformaldehyde (0.45 g, manufactured by Tokyo Chemical Industry Co., Ltd.), and 2,2'-iminodiethanol (1.58 g, manufactured by Wako Pure Chemical Industries, Ltd) were dissolved in ethanol (10 mL), and the solution was heated under reflux for 2 hours. The solvent was then removed by distillation using an evaporator under reduced pressure, and the resulting viscous solution was purified by silica gel column chromatography to obtain a viscous liquid (0.5 g).

Synthetic Example 2

Synthesis of Exemplary compound A-2

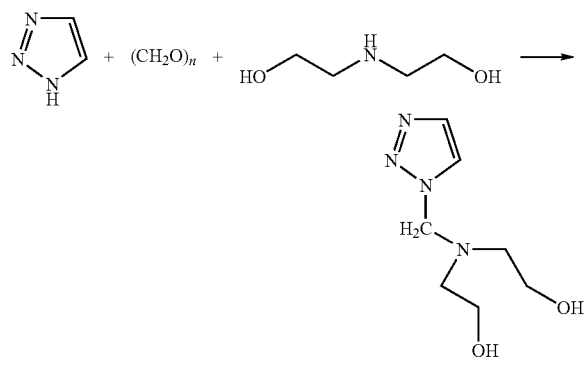

1,2,3-triazole (I-B) (1.04 g, manufactured by Tokyo Chemical Industry Co., Ltd.), paraformaldehyde (0.45 g, manufactured by Tokyo Chemical Industry Co., Ltd.), and 2,2'-iminodiethanol (1.58 g, manufactured by Wako Pure Chemical Industries, Ltd) were dissolved in ethanol (10 mL), and the solution was heated under reflux for 2 hours. The solvent was then removed by distillation using an evaporator under reduced pressure, and the resulting viscous solution was purified by silica gel column chromatography to obtain a viscous liquid (0.46 g).

Examples 1 to 14 and Comparative Examples 1 to 3

Polishing slurry Nos. 101 to 114 (Examples) and 201 to 203 (Comparative Examples) shown in Table 1, below were prepared for evaluation by polishing test. The number of the compounds of the present invention used for the preparation of the polishing slurry corresponds to the number of the compounds represented by the general formula (1) as described above.

[Preparation of Metal Polishing Slurry]

Each metal polishing slurry was prepared by mixing the following ingredients.

| | |
|---|---|
| the compound of the invention: the compound shown in Table 1 | 1.5 mmol/L |
| organic acid: the compound shown in Table 1 | 0.26 mol/L |
| abrasive: the compound shown in Table 1 | 3.2 g/L |
| surfactant: the compound shown in Table 1 | 0.01 g/L |
| oxidizing agent: hydrogen peroxide | 12.5 g/L |

Pure water was added to make up for the total volume of 1000 mL, and the pH was adjusted with ammonia solution to pH 7.5.

The colloidal silica used was commercially available products (manufactured by Fuso Chemical Co., Ltd.) in all Examples. The colloidal silica had a primary particle size (simply referred to as "particle size" in the table) of 20 to 70 nm.

The compound used as Comparative Compound 1 in Table 1 is the one represented by the following formula:

Comparative compound 1

The compound used as Comparative Compound 2 is the one represented by the following formula:

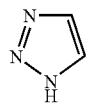

Comparative compound 2

The compound used as Comparative Compound 3 is the one represented by the following formula:

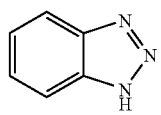

Comparative compound 3

[Polishing Test]

Polishing was conducted under the following conditions to evaluate the polishing speed and the dishing.

Polisher: FREX 300 (manufactured by Ebara Corporation)
Polishing object (wafer):

(1) The wafer used for evaluating the polishing speed: a blanket wafer having a diameter of 300 mm prepared by forming a Cu film having a thickness of 1.5 μm on a silicon substrate (2) The wafer used for evaluating the dishing: a wafer having a diameter of 300 mm having copper interconnects formed (patterned wafer: mask pattern 754 CMP manufactured by ATDF)

Polishing pad: IC1400-K Groove (manufactured by Rodel)
Polishing condition:
Polishing pressure (contact pressure between the surface to be polished and the polishing pad): 14,000 Pa
Feed speed of the polishing slurry: 200 ml/min
Rotation speed of polishing platen: 104 rpm
Rotation speed of polishing head: 85 rpm
[Evaluation Method]

Calculation of the polishing speed: The blanket wafer of (1) was polished for 60 seconds, and thickness of the metal film before and after polishing was determined from the electrical resistance at evenly distributed 49 locations on the surface of the wafer. The average value of the thickness change divided by the polishing time was defined as the polishing speed.

Evaluation of dishing: The patterned wafer of (2) was polished for the time required for completely removing the copper of non-interconnect areas by polishing plus 25% excess time. The step height of line-and-space areas (line 10 μm, space 10 μm) was measured by using a contact step height meter DEKTAK V3201 manufactured by Veeco Co.

The polished copper film was evaluated by counting the number of defects in the entire polished area using a wafer inspection apparatus (ComPLUS manufactured by Applied Materials). Next, 200 defects were randomly chosen from the defects detected by the wafer inspection apparatus, and scratches were counted in these 200 defects. The number of scratches (scratch count) in the entire wafer surface was estimated by the following equation.

Scratch count (count/surface)=Number of all defects detected by the wafer inspection apparatus (count/surface)×{(number of the defects which were the scratches in the 200 chosen defects)/200}

The results of the evaluation are shown in Table 1.

TABLE 1

| | | Polishing slurry | | | | Results of evaluation | | |
|---|---|---|---|---|---|---|---|---|
| | Type | | Organic acid | Abrasive (Particle size, association degree) | Surfactant | Polishing speed (angstrom/min) | Dishing (angstrom) | Scratch count (Count/surface) |
| | | Compound represented by general formula (1) | | | | | | |
| Ex. 1 | 101 | Compound A-1 of the invention | Glycine | Colloidal silica (40 nm, 2) | ELEMINOL MON | 7770 | 340 | 13 |
| Ex. 2 | 102 | Compound A-1 of the invention | Glycine | Colloidal silica (30 nm, 1) | ELEMINOL MON | 7550 | 335 | 15 |
| Ex. 3 | 103 | Compound A-1 of the invention | Glycine | Colloidal silica (30 nm, 1) | Newcol 220L | 7400 | 320 | 17 |
| Ex. 4 | 104 | Compound A-1 of the invention | N-methyl-glycine | Colloidal silica (20 nm, 2) | NEOPELEX No. 6 | 7150 | 340 | 15 |
| Ex. 5 | 105 | Compound A-2 of the invention | Glycine | Colloidal silica (40 nm, 2) | ELEMINOL MON | 8050 | 305 | 12 |
| Ex. 6 | 106 | Compound A-2 of the invention | α-alanine | Colloidal silica (40 nm, 2) | Newcol 220L | 7900 | 310 | 14 |
| Ex. 7 | 107 | Compound A-2 of the invention | N-methyl-glycine | Colloidal silica (20 nm, 1) | Newcol 220L | 7750 | 305 | 12 |
| Ex. 8 | 108 | Compound A-3 of the invention | Glycine | Colloidal silica (40 nm, 2) | Newcol 220L | 7400 | 330 | 16 |
| Ex. 9 | 109 | Compound A-3 of the invention | α-alanine | Colloidal silica (30 nm, 1) | NEOPELEX No. 6 | 7300 | 325 | 19 |
| | | Compound of general formula (1) | | | | | | |
| Ex. 10 | 110 | Compound A-3 of the invention | N-methyl-glycine | Colloidal silica (30 nm, 1) | ELEMINOL MON | 7150 | 330 | 18 |
| Ex. 11 | 111 | Compound A-4 of the invention | Glycine | Colloidal silica (40 nm, 2) | Newcol 220L | 7300 | 340 | 16 |
| Ex. 12 | 112 | Compound A-5 of the invention | Glycine | Colloidal silica (40 nm, 2) | Newcol 220L | 7350 | 330 | 18 |
| Ex. 13 | 113 | Compound A-6 of the invention | Glycine | Colloidal silica (40 nm, 2) | NEOPELEX No. 6 | 7200 | 330 | 13 |
| Ex. 14 | 114 | Compound A-6 of the invention | Glycine | Colloidal silica (40 nm, 2) | Newcol 220L | 7250 | 350 | 10 |
| Comp. Ex. 1 | 201 | Comparative Compound 1 | Glycine | Colloidal silica (40 nm, 2) | ELEMINOL MON | 6750 | 380 | 26 |
| Comp. Ex. 2 | 202 | Comparative Compound 2 | Glycine | Colloidal silica (40 nm, 2) | ELEMINOL MON | 4870 | 370 | 51 |
| Comp. Ex. 3 | 203 | Comparative Compound 3 | Glycine | Colloidal silica (40 nm, 2) | ELEMINOL MON | 3650 | 390 | 83 |

ELEMINOL MON: sodium dodecylalkyl diphenyl ether disulfonate manufactured by Sanyo Chemical Industries, Ltd.
Newcol 220L: sodium dodecylbenzene sulfonate manufactured by Nippon Nyukazai Co., Ltd.
NEOPELEX No. 6: dodecylbenzene sulfonate manufactured by Kao Corporation As demonstrated in Table 1, high polishing speed and reduced dishing could be simultaneously realized by the chemical mechanical polishing method using the metal polishing slurry of the present invention. The scratch count was also low, and the superiority of the compound of the present invention was thereby confirmed.

What is claimed is:

1. A metal polishing slurry used for chemical mechanical polishing in producing a semiconductor device, wherein the metal polishing slurry comprises a compound represented by the following general formula (1):

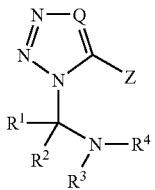

General formula (1)

wherein Q represents a nitrogen atom or $CR^5$, Z represents a hydrogen atom, a halogen atom, an aliphatic hydrocarbon group, an aryl group, a heterocyclic group, a carboxyl group, a carbamoyl group, an acylamino group, an amino group, or a cyano group, $R^1$ and $R^2$ independently represent a hydrogen atom, an aliphatic hydrocarbon group, an aryl group, or a heterocyclic group, $R^3$ and $R^4$ independently represent a hydrogen atom, an alkyl group having a carboxyl group, an alkyl group having a hydroxyl group, an alkyl group having a tertiary amino group, or an alkyl group, and $R^5$ represents a hydrogen atom, a halogen atom, an aliphatic hydrocarbon group, an aryl group, a heterocyclic group, a carboxyl group, a carbamoyl group, an acylamino group, or a cyano group, with the proviso that $R^1$ and $R^2$ or $R^3$ and $R^4$ may together represent a cyclic group, an oxidizing agent, and an organic acid.

2. The metal polishing slurry according to claim 1 wherein $R^5$ in $CR^5$ represented by Q in the general formula (1) is a hydrogen atom, an alkyl group, an aryl group, a heterocyclic group, a carboxyl group, a carbamoyl group, an acylamino group, or a cyano group.

3. The metal polishing slurry according to claim 1 wherein Q in the general formula (1) is a nitrogen atom.

4. The metal polishing slurry according to claim 1 wherein $R^1$ and $R^2$ in the general formula (1) are independently a hydrogen atom or a linear, branched, or cyclic alkyl group, an aryl group, or a heterocyclic group.

5. The metal polishing slurry according to claim 1 wherein $R^3$ and $R^4$ in the general formula (1) are independently a linear, branched, or cyclic alkyl group having a hydroxyl group.

6. The metal polishing slurry according to claim 1 wherein Z in the general formula (1) is a hydrogen atom, a linear, branched, or cyclic alkyl group, an aryl group, a heterocyclic group, a carboxyl group, a carbamoyl group, an acylamino group, an amino group, or a cyano group.

7. The metal polishing slurry according to claim 1 further comprising a surfactant represented by the following general formula (2):

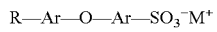

General formula (2)

wherein R represents a linear or branched alkyl group containing 8 to 20 carbon atoms, Ar represents an aryl group, and $M^+$ represents a hydrogen ion, an alkali metal ion, or an ammonium ion.

8. The metal polishing slurry according to claim 1 further comprising an abrasive.

9. The metal polishing slurry according to claim 8 wherein the abrasive is a colloidal silica having a primary particle size of 20 to 40 nm and a degree of association of up to 2.

10. The metal polishing slurry according to claim 9 wherein the colloidal silica is a colloidal silica in which at least a part of the silicon atoms on the surface are modified with aluminum atoms.

11. The metal polishing slurry according to claim 1 wherein the organic acid is an amino acid.

12. A chemical mechanical polishing method for polishing an object having a surface to be polished, wherein the metal polishing slurry of any one of claims 1 to 11 is supplied to a polishing pad on a polishing platen while rotating the polishing platen to move the polishing pad in relation to the surface to be polished of the object which is in contact with the polishing pad to thereby polish the surface to be polished of the object.

13. A metal polishing slurry used for chemical mechanical polishing in producing a semiconductor device, wherein the metal polishing slurry comprises:

a compound represented by the following general formula (1):

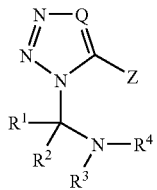

General formula (1)

wherein Q represents a nitrogen atom or $CR^5$, Z represents a hydrogen atom, a halogen atom, an aliphatic hydrocarbon group, an aryl group, a heterocyclic group, a carboxyl group, a carbamoyl group, an acylamino group, an amino group, or cyano group, $R^1$ and $R^2$ independently represent a hydrogen atom, an aliphatic hydrocarbon group, an aryl group, or a heterocyclic group, $R^3$ and $R^4$ independently represent a hydrogen atom, an alkyl group having a carboxyl group, an alkyl group having a hydroxyl group, an alkyl group having a tertiary amino group, or an alkyl group, and $R^5$ represents a hydrogen atom, a halogen atom, an aliphatic hydrocarbon group, an aryl group, a heterocyclic group, a carboxyl group, a carbamoyl group, an acylamino group, or a cyano group, an oxidizing agent, and an organic acid.

14. The metal polishing slurry according to claim 13 wherein $R^5$ in $CR^5$ represented by Q in the general formula (1) is a hydrogen atom, an alkyl group, an aryl group, a heterocyclic group, a carboxyl group, a carbamoyl group, an acylamino group, or a cyano group.

15. The metal polishing slurry according to claim 13 wherein Q in the general formula (1) is a nitrogen atom.

16. The metal polishing slurry according to claim 13 wherein $R^1$ and $R^2$ in the general formula (1) are independently a hydrogen atom or a linear, branched, or cyclic alkyl group, an aryl group, or a heterocyclic group.

17. The metal polishing slurry according to claim 13 wherein $R^3$ and $R^4$ in the general formula (1) are independently a linear, branched, or cyclic alkyl group having a hydroxyl group.

18. The metal polishing slurry according to claim 13 wherein Z in the general formula (1) is a hydrogen atom, a linear, branched, or cyclic alkyl group, an aryl group, a heterocyclic group, a carboxyl group, a carbamoyl group, an acylamino group, an amino group, or a cyano group.

19. The metal polishing slurry according to claim 13 further comprising a surfactant represented by the following general formula (2):

$$R-Ar-O-Ar-SO_3^-M^+ \quad \text{General formula (2)}$$

wherein R represents a linear or branched alkyl group containing 8 to 20 carbon atoms, Ar represents an aryl group, and M+ represents a hydrogen ion, an alkali metal ion, or ammonium ion.

20. The metal polishing slurry according to claim 13 further comprising an abrasive.

21. The metal polishing slurry according to claim 20, wherein the abrasive is a colloidal silica having a primary particle size of 20 to 40 nm and a degree of association of up to 2, and wherein the colloidal silica is a colloidal silica in which at least a part of the silicon atoms on the surface are modified with aluminum atoms.

22. A chemical mechanical polishing method for polishing an object having a surface to be polished, wherein the metal polishing slurry of claim 13 is supplied to a polishing pad on a polishing platen while rotating the polishing platen to move the polishing pad in relation to the surface to be polished of the object which is in contact with the polishing pad to thereby polish the surface to be polished of the object.

* * * * *